US00RE45356E

(19) United States
(12) Reissued Patent
Yoon et al.

(10) Patent Number: US RE45,356 E
(45) Date of Reissued Patent: Feb. 3, 2015

(54) PHASE-CHANGE MEMORY DEVICE USING SB-SE METAL ALLOY AND METHOD OF FABRICATING THE SAME

(75) Inventors: Sung Min Yoon, Suwon (KR); Nam Yeal Lee, Icheon (KR); Sang Ouk Ryu, Seoul (KR); Seung Yun Lee, Daejeon (KR); Young Sam Park, Daejeon (KR); Kyu Jeong Choi, Daejeon (KR); Byoung Gon Yu, Yeongdong (KR)

(73) Assignee: Electronics and Telecommunications Research Institute, Daejeon (KR)

(21) Appl. No.: 13/161,932

(22) Filed: Jun. 16, 2011

Related U.S. Patent Documents

Reissue of:
(64) Patent No.: 7,547,913
Issued: Jun. 16, 2009
Appl. No.: 12/063,991
PCT Filed: Aug. 30, 2006
PCT No.: PCT/KR2006/003416
§ 371 (c)(1),
(2), (4) Date: Mar. 7, 2008
PCT Pub. No.: WO2007/029938
PCT Pub. Date: Mar. 15, 2007

(30) Foreign Application Priority Data

Sep. 7, 2005 (KR) ..... 10-2005-0083420

(51) Int. Cl.
*H01L 29/08* (2006.01)

(52) U.S. Cl.
USPC ..... 257/42; 257/E21.068; 257/E21.075; 257/3; 257/613; 257/E45.002; 438/102

(58) Field of Classification Search
CPC ..... H01L 45/06; H01L 45/126; H01L 45/143; H01L 45/1675
USPC ..... 257/3, 613, E45.002, 42, E21.068, 257/E21.075; 438/102
See application file for complete search history.

(56) References Cited

U.S. PATENT DOCUMENTS 3,675,090 A * 7/1972 Neale ..... 257/3
4,633,273 A 12/1986 Watanabe et al.
5,534,712 A 7/1996 Ovshinsky et al.
5,825,046 A * 10/1998 Czubatyj et al. ..... 257/2
5,952,671 A * 9/1999 Reinberg et al. ..... 257/3

(Continued)

FOREIGN PATENT DOCUMENTS

JP 2000-260060 9/2000
KR 2004-0054250 6/2004
KR 2004-0076040 8/2004

OTHER PUBLICATIONS

Kang et al., "Structural transformation of SbxSe100-x thin films for phase change nonvolatile memory applications", Journal of Applied Physics, vol. 98, pp. 014904-1 to 014904-6, Jul. 2005.*

(Continued)

*Primary Examiner* — Mark Prenty
(74) *Attorney, Agent, or Firm* — NSIP Law

(57) ABSTRACT

Provided are a phase-change memory device using a phase-change material having a low melting point and a high crystallization speed, and a method of fabricating the same. The phase-change memory device includes an antimony (Sb)-selenium (Se) chalcogenide $Sb_xSe_{100-x}$ phase-change material layer contacting a heat-generating electrode layer exposed through a pore and filling the pore. Due to the use of $Sb_xSe_{100-x}$ in the phase-change material layer, a higher-speed, lower-power consumption phase-change memory device than a GST memory device can be manufactured.

14 Claims, 5 Drawing Sheets

(56) References Cited

U.S. PATENT DOCUMENTS

| | | | | |
|---|---|---|---|---|
| RE37,259 | E | 7/2001 | Ovshinsky | |
| 7,254,059 | B2 * | 8/2007 | Li et al. | 365/185.03 |
| 7,326,950 | B2 * | 2/2008 | Campbell | 257/2 |
| 7,361,925 | B2 * | 4/2008 | Happ et al. | 257/4 |
| 2003/0049912 | A1 | 3/2003 | Campbell et al. | |
| 2006/0091374 | A1 * | 5/2006 | Yoon et al. | 257/2 |
| 2007/0020799 | A1 * | 1/2007 | Choi et al. | 438/103 |

OTHER PUBLICATIONS

Sb-Se-Based Phase-Change Memory Device With Lower Power and Higher Speed Operations, IEEE Electron Device Letters, vol. 27, No. 6, pp. 445-447, by Yoon et al., Jun. 2006.*

R. Barton et al., "New phase change material for optical recording with short erase time", Applied Physics Letters, vol. 48, Issue 19, May 12, 1986, pp. 1255-1257.

* cited by examiner

PHASE-CHANGE MEMORY DEVICE USING SB-SE METAL ALLOY AND METHOD OF FABRICATING THE SAME

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

CROSS-REFERENCE TO RELATED PATENT [APPLICATION] *APPLICATIONS*

[This application] *The present patent application is a Reissue of U.S. Pat. No. 7,547,913, issued on Jun. 16, 2009, which is the National Stage of International Application No. PCT/KR2006/003416, filed Aug. 30, 2006, which* claims the benefit of Korean Patent Application No. 10-2005-0083420, filed on Sep. 7, 2005, in the Korean Intellectual Property Office, the [disclosure] *disclosures* of which [is] *are* incorporated herein in [its] *their* entirety by reference.

BACKGROUND OF THE INVENTION

1. Field of the Invention

The present invention relates to a phase change nonvolatile memory device and a method of fabricating the same, and more particularly, to a phase-change memory device using a chalcogenide metal alloy composed of antimony (Sb) and selenium (Se), and a method of fabricating the same.

2. Description of the Related Art

Semiconductor memory devices are generally classified as either volatile or non-volatile. A DRAM (dynamic random access memory) is a typical volatile memory device. The DRAM needs a periodic refresh process to retain data. When the integration density of a memory device is low, the power consumption of the refresh process is insignificant. However, as the integration density becomes higher, the power consumption also increases greatly. For example, at a refresh rate of 1~10 ms/Mbit, the DRAM consumes a great quantity of energy. The refresh process of a 1 Gbit DRAM is responsible for most of the device's total power consumption. However, DRAM memory modules are widely used, because their high power consumption is offset by high speed and competitive price.

If a volatile DRAM can be substituted with a non-volatile memory device, reductions in power consumption and operation initiation period are expected. Thus, various non-volatile memory technologies have been developed. Non-volatile memory that has been most advanced in technologies and most widely used is flash memory. However, flash memory is slow and uses a relatively high voltage. These problems limit the use of flash memory to mobile devices such as digital cameras and mobile phones. One of the important performances required for memory devices is reliability in re-writing operation. Although flash memory has low reliability in re-writing performance, the number of re-writing operations can be set to be smaller when flash memory is used in a mobile device such as a personal digital assistant. However, such a reliability of flash memory in re-writing in a mobile device does not ensure stable operation in a general-purpose PC.

A method of properly combining the DRAM/SRAM/flash memory is used to satisfy the various requirements of recent memory devices. However, this method is expensive and greatly increases the size of the memory chip. Thus, an integrated memory device that can be stably installed into various devices or can be used in various applications is required. It is required that the integrated memory device should have characteristics such as non-volatility, high speed, low power consumption, and highly reliable re-writing. However, a semiconductor memory device having all of these characteristics has not yet been commercially produced. Therefore, various non-volatile memory device technologies are being vigorously developed, and it has been tried to find the possibility of development and commercial usage of those technologies in various aspects.

Meanwhile, non-volatile memory devices, which are referred to as phase-change RAM (PRAM), use a phase-change material which changes resistance according to its crystal structure. PRAM devices store information by controlling a current to change the crystal structure of the phase-change material, and read the stored information using the change of resistance, thereby realizing its memory operation.

PRAM devices can use a chalcogenide metal alloy phase-change material that has been mainly used in optical information storage media, such as CD-RW or DVD. Also, since fabrication processes of the PRAM device closely match those of conventional silicon-substrate devices, the PRAM device can reach or exceed the integration density of the DRAM. Magneto-resistive RAM (MRAM) devices and ferroelectric RAM (FRAM) device are competition to PRAM devices, but have the problems of difficult manufacturing process and miniaturization. Thus, the PRAM device is attracting attention as an leading next generation non-volatile memory device which can replace current flash memory devices.

However, the power consumption of the PRAM device must be greatly reduced to make the PRAM device practical. As described above, since the PRAM device is driven by applying a current to a resistor and using the joule heat to change the crystal structure of a phase-change material, power consumption is likely to be high. Due to the power consumption problem, the PRAM device has just started receiving a great attention in recent years, even though it has favorable merits compared to other non-volatile memory devices.

That is, when a PRAM device is fabricated using a conventional larger-semiconductor device manufacturing process, excessive power and heat that the entire system cannot withstand are generated, thereby making it impossible to realize a practical memory device. However, due to the continuous reduction in design rule and device size, when a PRAM device is fabricated according to a currently common design rule, the power consumption required to operate the PRAM device can be markedly reduced. Reducing the current required to operate the PRAM device is closely related with the high-density integration of the PRAM device. Development of a low power device is necessary in order to secure reliable memory operation of a high-density PRAM device. In the low power device, the power consumption of a phase-change memory array is low.

In addition to the benefit of low power consumption, another important benefit obtainable with the low-power device is reduced heat generation. In particular, information stored in a memory device should not be destructed or changed by heat generated as a particular adjacent memory device operates. Especially, in a highly-integrated memory array where cells are very closed spaced, the heat generated by the operation of a particular memory cell may act as noise and interrupt the memory operation of an adjacent cell.

The following methods are applied to reduce the current required for the operation of the PRAM device.

(1) A first method is an approach in a material aspect. Modifying the phase-change material to lower the temperature required for phase change, by using a material having a relatively low melting point, thereby reducing the necessary current. This method reduces the power consumption of the whole PRAM device by changing the phase-change material itself regardless of the device structure.

(2) A second method is to reduce a required current level by minimizing the phase change region that is an essential part involved in the operation of the PRAM device. The PRAM device changes phase due to heat generated in a contact portion between a phase-change material and an electrode. Thus, the total power consumption of the PRAM device is reduced by minimizing the contact portion. At present, this method is most widely used.

(3) A third method is to optimize the structure of the PRAM device so as to sufficiently utilize the thermal energy of the phase-change material in the device. However, even though the heat generated in the contact portion can be reduced by minimizing the phase change region as in the second method described above, if the generated heat energy cannot be efficiently utilized, a relatively large amount of current has to be applied. Thus, in this method, a suitable device structure is provided so that the heat applied to the phase change region can be fully utilized to change the phase of the phase-change material without leakage, thereby minimizing the total power consumption of the phase-change memory.

When a phase-change memory device is manufactured in a combination of the above-described three methods, the power consumed when operating the phase-change memory device can be reduced the most.

The phase-change material is a chalcogenide metal alloy composed of germanium (Ge)—antimony (Sb)—tellurium (Te). The most common composition is $Ge_2Sb_2Te_5$(GST), where the composition of germanium-antimony-tellurium is at a ratio of 2:2:5. Since this GST composition has been widely used in optical storage media using phase change by laser beam, its physical characteristics are well known. Thus, GST can easily be applied to the PRAM device. At present, most PRAM devices use GST.

The integration density of a semiconductor memory device using a GST phase-change material (hereinafter, referred to as a GST memory device) can be increased to give a capacity of 256 Mb, and the operation characteristics of the GST memory device are very satisfactory (see S. J. Ahn et al., Tech. Dig. Symp, VLSI Tech 2005, pp 18-19). In the search for a next generation non-volatile memory device, much improved process and technology are required to exceed this integration density. FRAM or MRAM devices can reach only 16~32 Mb, because of the difficulty in fabrication processes. Thus, the PRAM has excellent scaling characteristics, and is an important replacement for the flash memory of today.

Non-volatile PRAM devices must operate more reliably in a high-density memory module in order to replace conventional flash memory. A gigabit non-volatile PRAM device needs an improved phase-change material. Because the conventional GST phase-change material has a high melting point (about 620° C.), reduction of the operation current is limited. Also, to increase the operation speed of the DRAM, it is necessary to develop a phase-change material having a higher phase change speed, particularly a higher crystallization speed.

Reduction of the power consumption and improvement of the operation speed can be partially realized by improving the device structure or the architecture of a driving circuit. However, since this increases the manufacturing complexity and reduces the uniformity of the device characteristics, it is desirable to improve the characteristics of the PRAM device while maintaining the conventional PRAM device structure, fabricating process, and driving circuit architecture.

A new phase-change material having a lower melting point and higher crystallization speed than GST would allow a high-speed, low power consumption non-volatile PRAM device to be fabricated cheaply and easily.

SUMMARY OF THE INVENTION

The present invention provides a phase change nonvolatile memory device that can operate at a high speed with a low power consumption and is fabricated using a phase-change material having a low melting point and a high crystallization speed.

The present invention also provides a method of fabricating a phase change nonvolatile memory device that can operate at a high speed with a low power consumption and is fabricated using a phase-change material having a low melting point and a high crystallization speed.

According to an aspect of the present invention, there is provided a phase-change memory device comprising a heat-generating electrode layer, and a first insulating layer partially covering the heat-generating electrode layer, exposing a portion of one side of the heat-generating electrode layer, and having a pore therein. The phase-change memory device comprises an antimony (Sb)-selenium (Se) chalcogenide $Sb_xSe_{100-x}$ phase-change material layer contacting the heat-generating electrode layer exposed by the pore, and filling the pore.

The content 'x' of antimony (Sb) in the $Sb_xSe_{100-x}$ phase-change material layer may be in the range of 40 to 70.

The melting point of the $Sb_xSe_{100-x}$ phase-change material layer may be in the range of 540 to 570° C. The melting point of the $Sb_xSe_{100-x}$ phase-change material layer may be 50 to 80° C. lower than the melting point of a $Ge_2Sb_2Te_5$ phase-change material layer.

A time required for crystallization of the $Sb_xSe_{100-x}$ phase-change material layer may be decreased as the content (x) of antimony is increased. The crystallization temperature of the $Sb_xSe_{100-x}$ phase-change material layer may be at least higher than 122° C.

According to another aspect of the present invention, there is provided a method of fabricating a phase-change memory device comprising preparing a substrate. Then, a heat-generating electrode layer is formed on the substrate. A first insulating layer having a pore therein is formed to partially cover the heat-generating electrode layer and to expose a portion of the heat-generating electrode layer. An antimony (Sb)-selenium (Se) chalcogenide $Sb_xSe_{100-x}$ phase-change material layer is formed to contact the portion of the heat-generating electrode layer exposed through the pore, and to fill the pore.

The content 'x' of antimony (Sb) in the $Sb_xSe_{100-x}$ phase-change material layer may be in the range of 40 to 70.

The $Sb_xSe_{100-x}$ phase-change material layer may be formed by dry etching so as to remain only in a phase change region around the pore. The pressure of a chamber for etching the $Sb_xSe_{100-x}$ phase-change material layer may be in the range of 3 to 5 mTorr. An etch gas for etching the $Sb_xSe_{100-x}$ phase-change material layer may be a mixture of argon (Ar) and chlorine ($Cl_2$).

The method may further comprise forming a second insulating layer covering the phase-change material layer after forming the $Sb_xSe_{100-x}$ phase-change material layer. The second insulating layer may be formed by electron cyclotron resonance (ECR) plasma chemical vapor deposition. The second insulating layer may be formed at room temperature.

The present invention provides a method of fabricating a phase-change memory device using a phase-change material having a low melting point and a high crystallization speed, giving the phase-change memory device a high speed and a low power consumption. The present invention provides a method of fabricating a phase-change memory device using a metal alloy of antimony and selenium as a phase-change material. The phase-change material composed of the metal alloy ensures the phase-change memory device to more reliably operate than a conventional GST material.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1:
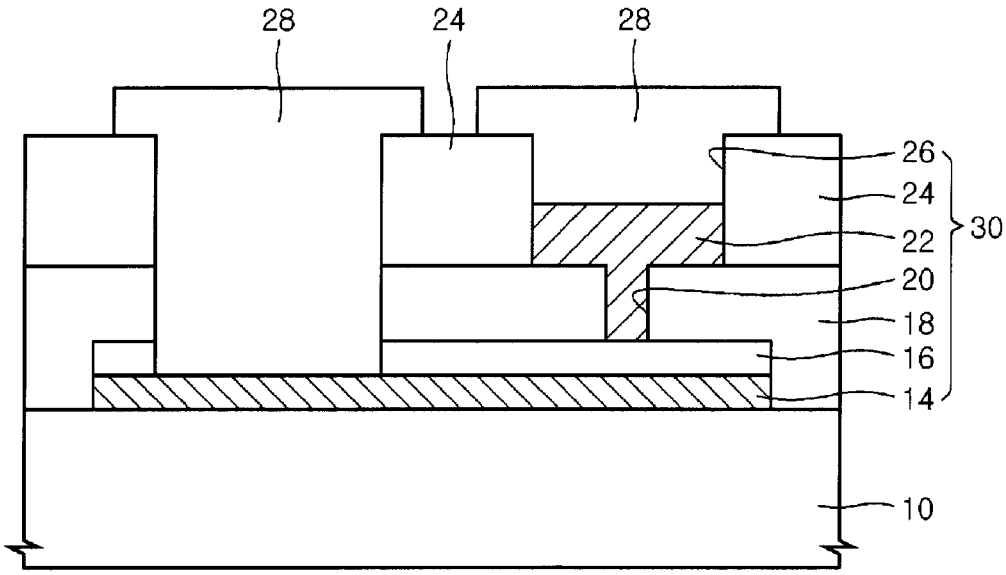
FIG. 1 is a sectional view illustrating the structure of a phase-change memory device according to an embodiment of the present invention.

The present invention will now be described more fully with reference to the accompanying drawings, in which preferred embodiments of the invention are shown. This invention may, however, be embodied in many different forms, and should not be construed as being limited to the embodiments set forth herein. Rather, these embodiments are provided so that this disclosure will be thorough and complete, and will fully convey the scope of the invention to those skilled in the art. In the drawings, the thicknesses of layers and regions are exaggerated for clarity. In addition, when it is described that one layer is positioned 'on' another layer or substrate, the layer can be formed directly on the other layer or substrate, or further unspecified intervening layers may be present. Like numbers refer to like elements throughout the specification.

FIG. 1 is a sectional view illustrating the structure of a phase-change memory device according to an embodiment of the present invention.

Referring to FIG. 1, a substrate 10 employs, for example, a silicon substrate or a silicon oxide layer prepared by thermally oxidizing the surface of silicon. In the meantime, a phase change semiconductor memory device using a $Sb_xSe_{100-x}$ phase-change material according to an embodiment of the present invention (hereinafter, referred to as a $Sb_xSe_{100-x}$ memory device) may be structured as an array. When the $Sb_xSe_{100-x}$ memory device will be integrally formed with circuit modules such as an XY decoder for driving a memory array, a sense amp, and the like, the memory device may be formed on a substrate having CMOS transistors to form such circuits aligned thereon.

A stack 30 of the phase-change memory device is located on a substrate 10.

The stack 30 of the memory device has a structure in which a lower electrode layer 14, a heat-generating electrode layer 16, a first insulating layer 18, such as a silicon oxide layer, a phase-change material layer 22, a second insulating layer 24, and an upper electrode layer 28 are sequentially stacked. In the meantime, the stack 30 of the $Sb_xSe_{100-x}$ memory device according to an embodiment of the present invention is not necessarily formed on the substrate 10, which is composed of a silicon substrate or a silicon oxide layer. For example, the stack 30 of the $Sb_xSe_{100-x}$ memory device may be formed on a predetermined substrate in which a transistor that is to be connected to the array of the $Sb_xSe_{100-x}$ memory device is formed.

The lower electrode layer 14 functions as a lower terminal of the phase-change memory device, and is formed of a low-resistance metal electrode. The metal electrode may be formed of, for example, platinum (Pt), tungsten (W), or titanium tungsten alloy (TiW), using a typical metal electrode formation method.

The heat-generating electrode layer 16 generates sufficient heat to change the crystal structure of a phase-change material in a region contacting the phase-change material layer 22. The heat is generated due to a current supplied through the lower electrode layer 14, and the resistance of the heat-generating electrode layer 16 is higher than that of the lower electrode layer 14. The material of the heat-generating electrode layer 16 is an important factor in determining the operation characteristics of the phase-change memory device. Further, the method of forming the material for the heat-generating electrode layer 16 determines the characteristics of the material, and must be determined carefully. The heat-generating electrode layer 16 may be composed of at least one material selected from, for example, titanium nitride (TiN), titanium oxynitride (TiON), titanium aluminum nitride (TiAlN), tantalum aluminum nitride (TaAlN), and tantalum silicon nitride (TaSiN).

The first insulating layer 18 electrically insulates the overlaying phase-change material layer 22 and the underlying heat-generating electrode layer 16 and lower electrode layer 14 from another stack. The second insulating layer 24 electrically insulates the phase-change material layer 22 and the upper electrode layer 28 from another stack. Concurrently, the first insulating layer 18 thermally insulates the phase-change material layer 22 and the heat-generating electrode layer 16 by allowing only a portion of the phase-change material layer 22 and a portion of the heat-generating electrode layer 16 to contact each other. The first insulating layer 18 may be formed at a low temperature. This is because the heat-generating electrode layer 16, which is commonly formed, must not be oxidized during a process of forming the first insulating layer 18. The second insulating layer 24 may be formed at a low temperature. This is for preventing oxidation of the phase-change material layer 22 and change of the crystal structure of the phase-change material layer 22. Further, since the heat transfer characteristics of the first insulating layer 18 and the second insulating layer 24 significantly influence the operation of the phase-change memory device, it is necessary to carefully select the material of the first and second insulating layers 18 and 14. The first insulating layer 18 and the second insulating layer 24 may be composed of at least one selected from among a silicon oxide layer, a silicon nitride layer (SiN), a silicon group insulating layer, and an organic insulating layer which can be formed at a low temperature.

The phase-change material layer 22 is the most essential material for forming the phase-change memory device, and is normally composed of a chalcogenide metal alloy. The phase-change material layer 22 may have various phase change characteristics according to the kinds of elements and the composition of the metal alloy. Examples of the chalcogenide metal elements constituting the phase-change material for the phase-change memory device include, for example, Ge, Se, Sb, Te, Sn, As, etc., which are used in proper combinations. Furthermore, in addition to the use of the combinations of chalcogenide metal elements, by using a mixture of elements, such as Ag, In, Bi, Pb, etc., the characteristics of the phase-change material can be improved. $Ge_2Sb_2Te_5$, which is a combination of Ge, Sb, and Te in a ratio of 2:2:5 and is most widely used in optical storage devices, can be used for a phase-change memory device. The phase-change material layer 22 may be formed by sputtering, electron beam deposition, or the like. The upper electrode layer 28 functions as an upper terminal of the phase-change memory device, and is formed of a low-resistance metal electrode, like the lower electrode layer 14.

In the $Sb_xSe_{100-x}$ memory device according to an embodiment of the present invention, $Sb_xSe_{100-x}$ is used as a material of the phase-change material layer 22. The present invention is limited to a phase-change memory including using the phase-change material layer 22 formed of $Sb_xSe_{100-x}$.

The $Sb_xSe_{100-x}$ used in the $Sb_xSe_{100-x}$ memory device according to an embodiment of the present invention has been used as a phase-change material for an optical storage device (refer to R. Barton at al., Appl. Phys. Lett., Vol. 48, pp. 1255-1257, 1986; V. I. Milka et al., Mat. Sci. Eng. B, Vol. 48, pp. 74-78, 2001). In particularly, $Sb_xSe_{100-x}$ is known as having a relatively low melting point and a low heat conductivity, and thus is very useful for products requiring these characteristics. However, since $Sb_xSe_{100-x}$ has a low absorption coefficient in the wavelength range of 750 nm to 830 nm, it has a problem that noise may be significantly increased as repeated programming operations are performed on an optical disk. Therefore, $Sb_xSe_{100-x}$ has seldom been used as a phase-change material of an optical storage device.

However, considering a phase equilibrium diagram of $Sb_xSe_{100-x}$, $Sb_xSe_{100-x}$ has a melting point of 540° C. to 570° C. in a composition where $40 \leq x \leq 70$, which is 50° C. to 80° C. lower than the melting point of GST used in a conventional phase-change memory device. However, since the absorption coefficient characteristics of optical signals are not required in a phase-change memory device, a low power consumption phase-change memory device can be easily realized even using the material having such a low melting point.

The composition of $Sb_xSe_{100x}$ according to an embodiment of the present invention is very important in the fabrication of a phase-change memory device. The basic characteristics of a $Sb_xSe_{100-x}$ phase-change material are already known (see M. J. Kang et al., J. Appl. Phys. Vol. 98, pp. 014904, 2005). This article discloses the characteristics of $Sb_xSe_{100-x}$ having a composition where $60 \leq x \leq 70$. In the article, it is acknowledged that the crystallization temperature of $Sb_xSe_{100-x}$ is lowered from 161° C. to 122° C. when the content (x) of antimony (Sb) is increased from 60% to 70%. Further, it is also acknowledged that the minimum time required for crystallization is reduced when the content (x) of antimony (Sb) is increased.

The crystallization temperature of $Sb_{70}Se_{30}$ (x=70) is 122° C., which is so low that it is not appropriate for a phase-change memory device according to an embodiment of the present invention. This is because while data is continuously stored in the phase-change memory device, the stored data must not be changed due to the heat generated by the memory during operation. Programmed data using the amorphous structure of a phase-change material may be made unreadable due to undesired recrystallization of the phase-change material during operation processes. Further, data stored in a memory cell must not be changed during the operation of a neighboring memory cell. However, the crystallization temperature of 122° C. is too low to satisfy these requirements. Therefore, in the fabrication of the phase-change memory device according to an embodiment of the present invention, the content 'x' of $Sb_xSe_{100-x}$ must be set to 70 or less.

Further, the phase-change material is required to have a high crystallization speed in order to achieve a high-speed phase-change memory device. According to the above article, the crystallization speed is increased as the content 'x' of $Sb_xSe_{100-x}$ is increased. When the content 'x' is increased within the range which does not decrease the crystallization temperature too much, the operation speed of the phase-change memory device can be improved. For example, when the content 'x' of the $Sb_xSe_{100-x}$ is 65, the crystallization temperature of the $Sb_{65}Se_{35}$ material is 152° C. This crystallization temperature is high enough not to cause recrystallization of the phase-change material during the operation of the memory device. Further, according to the article, the crystallization speed of $Sb_{65}Se_{35}$ is much higher than that of the GST, which has been typically used for conventional phase-change memory devices. Further, considering a phase equilibrium diagram of $Sb_xSe_{100-x}$, it is acknowledged that the content 'x' for the most stable composition of $Sb_xSe_{100-x}$ is 40, that is, $Sb_2Se_3$. When the content 'x' is 40 or less, the material characteristics of the $Sb_xSe_{100-x}$ become very unstable, and may be greatly changed depending on the content 'x'.

Therefore, when a phase-change memory device is fabricated using a material having a content 'x' of $Sb_xSe_{100-x}$ in the range of 40 to 70, the phase-change memory device can be provided with a higher speed and a lower power consumption than the conventional GST memory device.

The change of electrical conductivity and the electrical switching phenomenon in accordance with the content 'x' of $Sb_xSe_{100-x}$ have been reported (see H. A. Zayed et al., J. Phys. D, Vol. 28, pp. 770-773, 1995; V. I. Mikla et al., J. Mat. Sci. Vol. 35, pp. 4907-4912, 2000; E. H. Aly at al., J. Phys. D, Vol. 33, pp. 2549-2522, 2000), but a phase-change memory device using $Sb_xSe_{100-x}$ has not been fabricated. Therefore, according to an embodiment of the present invention, a high-speed, low-power consumption phase-change memory device is fabricated using $Sb_xSe_{100-x}$. Further, the phase change memory device can operate at a higher speed and has a lower power consumption than a conventional GST memory device fabricated by the same method.

Figure 2:
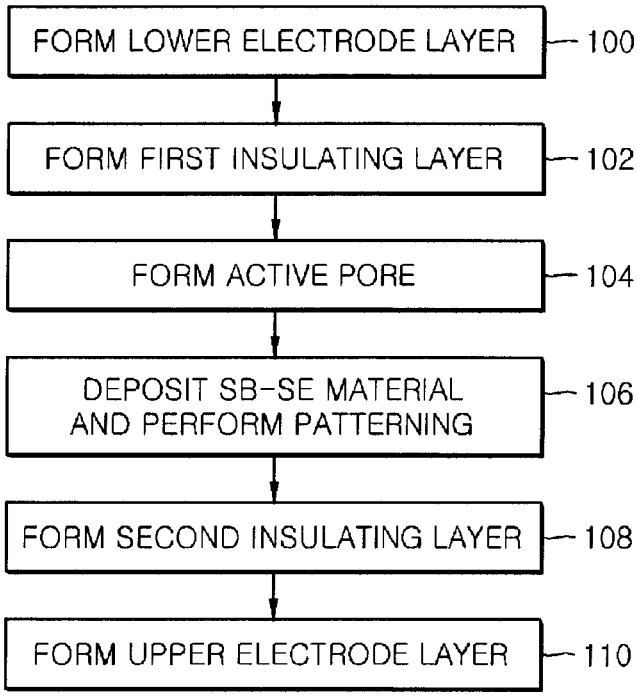
FIG. 2 is a flow chart illustrating a method of fabricating a $Sb_xSe_{100-x}$ memory device according to an embodiment of the present invention.

FIG. 2 is a flowchart illustrating a method of fabricating a $Sb_xSe_{100-x}$ memory device according to an embodiment of the present invention. The method of fabricating a phase-change memory device shown in FIG. 2 is focused on a process of forming a stack 30 of the phase-change memory device.

Further, the method of fabricating a phase-change memory device in FIG. 2 is only for illustrative purpose and can be modified in various ways within the scope of the invention. A phase-change memory device fabricated according to the method will be described with reference to FIG. 1.

Referring to FIG. 2, a lower electrode layer 14 is formed on a substrate 10. The lower electrode layer 14 functions as a lower terminal of a $Sb_xSe_{100-x}$ memory device and is formed of a low-resistance metal in the method according to an embodiment of the present invention. The lower electrode layer 14 may be formed of, for example, platinum (Pt), tungsten (W), titanium tungsten alloy (TiW), etc., using a general method, for example, sputtering, electron beam metal deposition, etc. Then, a heat-generating electrode layer 16 is formed on the lower electrode layer 14. The heat-generating electrode layer 16 generates sufficient heat to change the crystal structure of a phase-change material in a contact portion with a phase-change material layer 22. The resistance of the heat-generating electrode layer 16 may be higher than the resistance of the lower electrode layer 14. The heat-generating electrode layer 14 may be composed of a material, such as titanium nitride (TiN), titanium oxynitride (TiON), titanium aluminum nitride (TiAlN), tantalum aluminum nitride (TaAlN), tantalum silicon nitride (TaSiN), etc.

In the embodiment of the present invention, the lower electrode layer 14 is formed of titanium tungsten (TiW) using a sputtering method so as to have a thickness of about 500 Å. Further, the heat-generating electrode layer 16 is composed of titanium nitride (TiN) using a sputtering method so as to have a thickness of about 500 Å (operation 100).

Then, a first insulating layer 18 is formed using a typical method. The first insulating layer 18 electrically or thermally insulates individual memory devices in an array structure of the phase-change memory device. The first insulating layer 18 may be formed of a silicon oxide layer or a silicon nitride layer, but is not limited thereto, and may be formed of other insulating material layers having similar characteristics. For example, when the first insulating layer 18 is formed of a silicon oxide layer, the silicon oxide layer may be formed by chemical vapor deposition at a low temperature. This is for preventing oxidation of the heat-generating electrode layer 16 during the process of forming the first insulating layer 18. Further, appropriate device isolation can be achieved through the formation of the first insulating layer 18. That is, when the first insulating layer 18 is formed of a silicon oxide layer, separate portions to be phase-change memory device regions are defined through a dry or wet etch process.

In the embodiment of the present invention, a silicon oxide ($SiO_2$) layer having a thickness of about 2000 Å is formed as the first insulating layer using plasma enhanced chemical vapor deposition (PECVD). The silicon oxide layer is formed at a temperature of about 400° C. (operation 102).

Then, the first insulating layer 18 is etched to form a fine hole through which the phase-change material layer 22 and the heat-generating electrode layer 16 contact. The fine hole is a portion where the phase-change memory device actually operates, and is formed as a hole or a pore. Hereinafter, the pore portion is referred to as an active pore 20. The size of the active pore 20 directly affects the operation characteristics of the phase-change memory device, and a reduction of the pore size may decrease the current required for operation. In the meantime, the size of the active pore 20 may be varied according to a photolithography process used and the conditions of an etch process.

In an embodiment of the present invention, the active pore 20 is formed using an i-line lithography equipment, and the size of the pore 20 is about 500 nm. The active pore 20 is formed by dry etching the silicon oxide layer.

The size of the active pore 20 is about 500 nm, which is large enough to satisfy the conditions required for the operation of a commercially available phase-change memory device. The method of fabricating a $Sb_xSe_{100-x}$ memory device according to the present invention described above provide exemplary process conditions for fabricating a phase-change memory device with a higher speed and lower power consumption than conventional devices. Therefore, when actually fabricating a $Sb_xSe_{100-x}$ memory device according to the present invention, the active pore 20 may be formed to be smaller than as described above. In this case, patterning equipment using KrF, ArF, electron beam lithography, etc., which have a higher patterning resolution than the i-line lithography patterning equipment, may be used (operation 104).

Next, the phase-change material layer 22 is formed in the active pore 20. The phase-change material layer 22 has various phase change characteristics according to the components and composition of a metal alloy, and is very important in the operation of the phase-change memory device. Conventionally, $Ge_2Sb_2Te_5$, which is composed of Ge, Sb, and Te in a ratio of 2:2:5, has been widely used. In addition to the GST material, an As—Sb—Te chalcogenide alloy material (see K. Nakayama et al., Jpn, J. Appl. Phys., Vol. 39, pp. 6157-6161, 2000) or a Se—Sb—Te chalcogenide alloy material (see K. Nakayama et al., Jpn, J. Appl. Phys., Vol. 32, pp. 404-408, 2003) has been experimentally synthesized. The phase-change material layer may be formed using sputtering, electron beam deposition, or the like. A target source material may be prepared as a multi-component material or a single-component material.

The phase-change material layer 22 is patterned using an etch process so that the phase-change material layer 22 remains only in a predetermined region where a phase-change memory device will be fabricated. A chalcogenide phase-change material has been used mainly as a material of a recording medium of an optical data storage disc. However, semiconductor process characteristics of the chalcogenide phase-change material, such as etching characteristics, are mostly not known, and thus, it is necessary to set up efficient etching conditions for fabricating a phase-change memory device using a phase-change material having a predetermined composition of elements. Dry etching equipment using plasma may be used in the etching process. In this case, an appropriate etching gas has to be used.

In order to fabricate a $Sb_xSe_{100-x}$ memory device according to an embodiment of the present invention, $Sb_xSe_{100-x}$ is prepared using an ultrahigh vacuum, multi-component deposition method. At this time, a Knudsen Cell (K-Cell) equipment is used to deposit a source material, and the degree of vacuum during the deposition is about $5\times10^{-8}$ mbar. However, $Sb_xSe_{100-x}$ can be synthesized using a general multi-component or single-component sputtering, instead of the ultrahigh vacuum multi-component deposition method using the K-Cell.

Further, in order to fabricate a $Sb_xSe_{100-x}$ memory device according to an embodiment of the present invention, dry etch characteristics of $Sb_xSe_{100-x}$ are utilized. In this embodiment, a high-density helicon plasma apparatus using helicon plasma is used as a dry etching apparatus, and a mixture of argon (Ar) and chlorine ($Cl_2$) is used as an etching gas. In an etch process, an RF source power of about 600 W is applied, and an RF bias power of about 150 W is applied to improve the anisotropic property of plasma. Meanwhile, a chamber pressure of 3 to 5 mTorr is maintained during the etch process. The composition of $Ar/Cl_2$ used in the etch process is about 90/10, and the etch rate of the $Sb_xSe_{100-x}$ is about 200 nm/min.

To prevent the first insulating layer 18 from being over-etched in the etching process, the first insulating layer 18 should have a sufficient etch selectivity with respect to the $Sb_xSe_{100-x}$. The etch rate of the silicon oxide first insulating layer 18 is about 40 nm/min, and the etch selectivity is about 5. Since the etch selectivity is sufficiently high, the $Sb_xSe_{100-x}$ is patterned using the etch apparatus and the etch conditions described above. In the embodiment, an optimized phase-change memory device is fabricated using $Sb_{65}Se_{35}$ where the content 'x' of antimony is 65 (operation 106). However, according to the present invention the content 'x' of antimony in $Sb_xSe_{100-x}$ may be in the range of 40 to 70. The composition of $Sb_{65}Se_{35}$ where the content 'x' of antimony is 65 is as an exemplary composition, and thus the present invention is not limited thereto.

Then, a second insulating layer 24 is formed on the phase-change material layer 22. The second insulating layer 24 electrically insulates the phase-change material layer 22 and an upper electrode layer 28 that is to be formed on the phase-change material layer 22 from another stack. The second insulating layer 24 may be formed at a low temperature in order to prevent oxidation of the phase-change material layer 22 and diffusion of the component elements of the phase-change material layer 22. Further, the crystal structure of the phase-change material layer 22 should not be changed during the process of forming the second insulating layer 24.

In an embodiment of the present invention, a silicon oxide layer having a thickness of about 2000 Å is formed as the second insulating layer 24 using ECR plasma chemical vapor deposition (ECRCVD). At this time, the silicon oxide layer is formed at room temperature. That is, the silicon oxide layer may be formed using ECRCVD at room temperature. The process of forming the silicon oxide layer at room temperature is a feature of the method of fabricating a phase-change memory device according to the present invention (operation 108).

Then, a via hole 26 for forming the upper electrode layer 28 is formed in the second insulating layer 24. The second insulating layer 24 may be removed using a wet or dry etching process in order to form the via hole 26. The upper electrode layer 28 is formed on the second insulating layer 24 in which the via hole 26 is formed. The upper electrode layer 28 functions as an upper terminal of the phase-change memory device, and is formed of a low-resistance metal electrode, like the lower electrode layer 14. An additional metal layer (not shown) may be further provided in order to improve the contact between the upper electrode layer 28 and the phase-change material layer 22, and prevent unnecessary reaction or movement of elements at the interface. In the embodiment of the present invention, the upper electrode layer 28 is formed of tungsten (W) to a thickness of about 1000 Å by sputtering (operation 110).

The $Sb_xSe_{100-x}$ memory device according to the present invention has a high speed and low power consumption. To prove this, a conventional GST memory device was fabricated as a comparative example using the same method as illustrated in FIG. 2. In this embodiment, RF sputtering using a single-component target is used to form a GST phase-change material layer.

The structure of the $Sb_xSe_{100-x}$ memory device according to the present invention, the composition of the component materials, and the method of fabricating the device described above can be partially modified in order to improve the characteristics of the phase-change memory device. The structure of the $Sb_xSe_{100-x}$ memory device according to the present invention is not limited to the structure illustrated in FIG. 1, and may be fabricated in various forms. That is, the structure of the phase-change memory device and the method of fabricating the same described above should be construed as a typical structure and fabrication method provided for effectively describing the $Sb_xSe_{100-x}$ memory device according to the present invention. Therefore, the present invention is not limited to the embodiments described above, and it will be apparent to those skilled in the art that various changes in form and details may be made therein without departing from the spirit and scope of the present invention.

Figure 3:
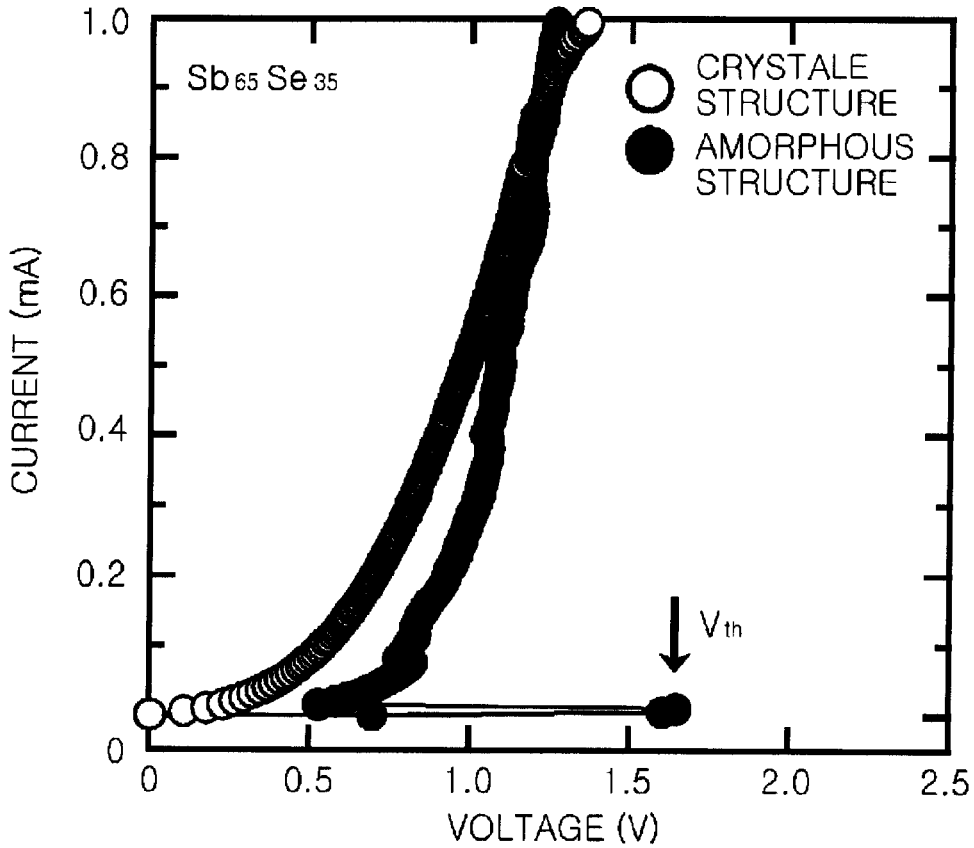
FIG. 3 is a graph of the current-voltage characteristics of a $Sb_xSe_{100-x}$ (x=65) memory device according to an embodiment of the present invention.

FIG. 3 is a graph of current-voltage characteristics of a $Sb_xSe_{100-x}$ (x=65) memory device according to an embodiment of the present invention. The current was changed from 0 mA to 1 mA, and the voltage in the memory device was continuously measured. The content 'x' of antimony in the $Sb_xSe_{100-x}$ memory device according to the present invention may be 40 to 70. The composition of $Sb_xSe_{100-x}$ memory device where x=65 disclosed herein must be understood as an example of the present invention.

Referring to FIG. 3, in the $Sb_xSe_{100-x}$ memory device according to the present invention, during a SET operation by an amorphous structure having a high resistance changes to a crystal structure having a low resistance, negative resistance characteristics appear. The negative resistance characteristics indicate that nonvolatile operation is possible in the phase-change memory device according to the present invention through the phase change phenomenon. This is because a crystal structure is changed due to the joule heat generated when the voltage exceeds a threshold voltage, so that the phase-change material undergoes a rapid change of resistance. The negative resistance characteristics and threshold voltage are essential to identify the operation characteristics of a phase-change memory device according to the phase change of the phase-change material.

The $Sb_xSe_{100-x}$ (x=65) memory device according to an embodiment of the present invention shows apparent negative resistance characteristics during the SET operation, and has a threshold voltage of about 1.65 V. Therefore, a nonvolatile memory programming operation is possible due to the phase change of the $Sb_xSe_{100-x}$ (x=65) memory device according to the embodiment of the present invention.

Figure 4A:
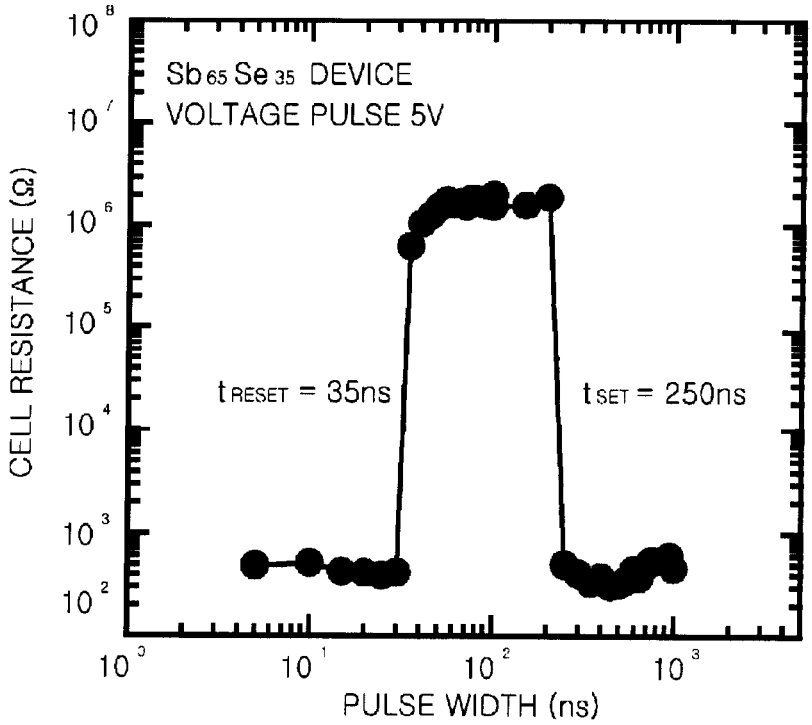
FIG. 4A is a graph of SET and RESET operation characteristics when a voltage is applied to a $Sb_xSe_{100-x}$ (x=65) memory device according to an embodiment of the present invention.
Figure 4B:
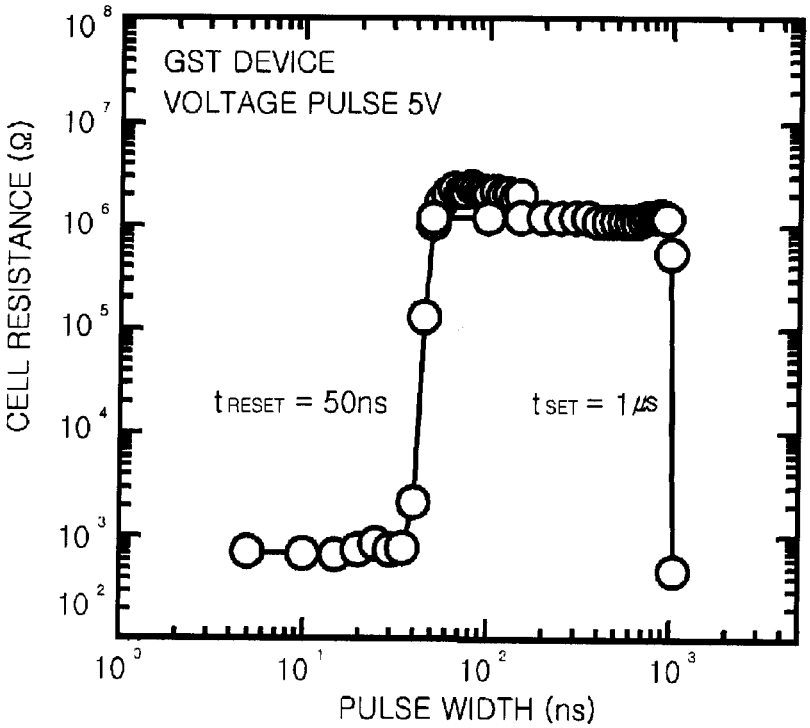
FIG. 4B is a graph of SET and RESET operation characteristics when a voltage is applied to a GST memory device fabricated for comparison with the memory device according to the present invention.

FIG. 4A is a graph of SET and RESET operation characteristics when a voltage is applied to a $Sb_xSe_{100-x}$ (x=65) memory device according to an embodiment of the present invention. FIG. 4B is a graph of SET and RESET operation characteristics when a voltage is applied to a GST memory device fabricated for comparison according to an embodiment of the present invention. The voltage applied for the SET and RESET operations was 5 V, and the operation times required for the SET and RESET operations were measured while changing the pulse width of the voltage. The resistance of the phase-change memory device was measured at 1 V.

A $Sb_xSe_{100-x}$ memory device according to the present invention and a GST memory device were simultaneously fabricated using the same method to have the same device structure. SET and RESET operations of the two memory devices when a voltage was applied thereto were compared in order to check the operation speeds and low-power consumption characteristics of the two devices. In the current embodiment, the $Sb_xSe_{100-x}$ memory device was compared with the conventional GST memory device for the following reason. When the size of the active pore 20 of the $Sb_xSe_{100-x}$ (x=65) memory device of the present invention is about 500 nm as in the current embodiment, it is difficult to satisfy the operating conditions of a commercially available phase-change memory device. Therefore, in order to demonstrate the high speed and low-power consumption characteristics of the $Sb_xSe_{100-x}$ (x=65) memory device, the operation characteristics of the $Sb_xSe_{100-x}$ (x=65) memory device was compared with the operation characteristics of the conventional GST memory device.

Referring to FIGS. 4A and 4B, the pulse widths of the signals required for SET and RESET operations in the conventional GST memory device are respectively 1 μis and 50 ns. The pulse widths of signals required for SET and RESET operations in the $Sb_xSe_{100-x}$ (x=65) memory device according to the present invention are respectively 250 ns and 35 ns. The time required for the SET operation is much shorter in the $Sb_xSe_{100-x}$ (x=65) memory device according to the present invention. This means that the $Sb_xSe_{100-x}$ (x=65) memory device according to the present invention has a higher crystallization speed than the conventional GST memory device. The operation speed of the phase-change memory device depends entirely on the speed of a SET programming to change a high resistance amorphous structure to a low resistance crystal structure. This is because the change from a low resistance crystal structure to a high resistance amorphous structure in the RESET operation is relatively very fast. Therefore, it is necessary to improve the SET operation speed to allow high speed operation of the phase-change memory device, and for that purpose, a phase-change material having a high crystallization speed is preferably employed. Therefore, the $Sb_xSe_{100-x}$ (x=65) memory device according to the present invention can operate faster than the conventional GST memory device.

Figure 5A:
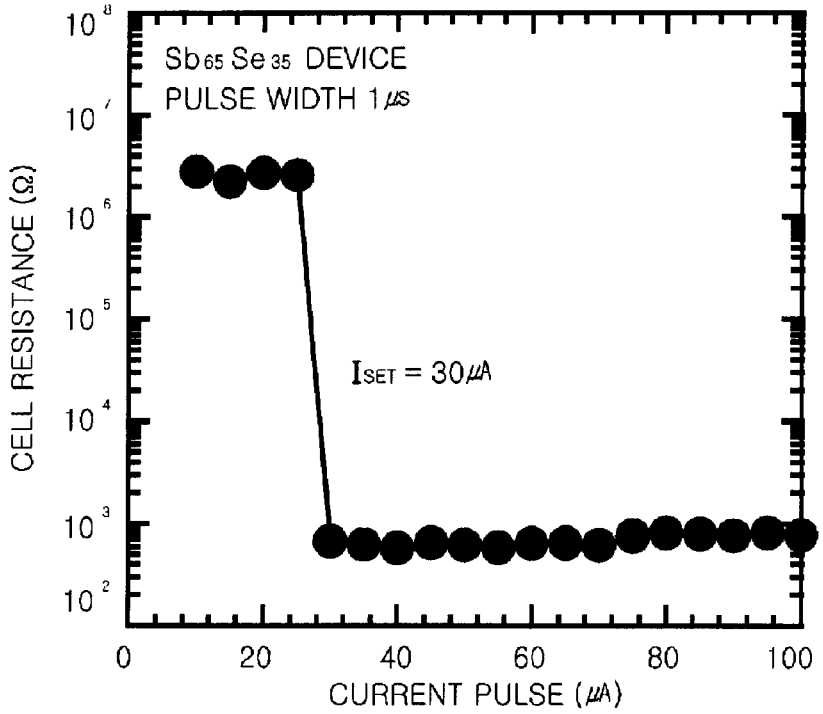
FIG. 5A is a graph of SET programming operation characteristics when a current is applied to a $Sb_xSe_{100-x}$ (x=65) memory device according to an embodiment of the present invention.
Figure 5B:
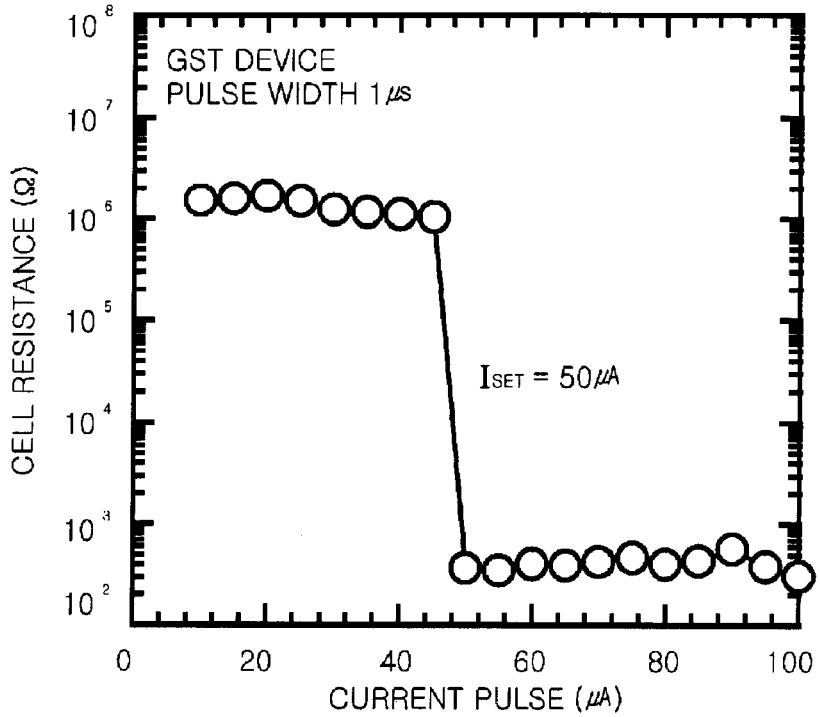
FIG. 5B is a graph of SET programming operation characteristics when a current is applied to a GST memory device fabricated for comparison with the memory device according to the present invention.

FIG. 5A is a graph of SET programming operation characteristics when a current is applied to a $Sb_xSe_{100-x}$ (x=65) memory device according to an embodiment of the present invention. FIG. 5B is a graph of SET programming operation characteristics when a current is applied to a GST memory device fabricated for comparison according to an embodiment of the present invention. The resistance of each device was measured while changing the current applied to record data. The pulse width of the applied current was 1 μs.

Referring to FIGS. 5A and 5B, the current required for the SET operation in the conventional GST memory device was about 50 μA. The current required for the SET operation in the $Sb_xSe_{100-x}$ (x=65) memory device according to an embodiment of the present invention was 30 μA. That is, the programming current required for the SET operation is reduced by employing the $Sb_xSe_{100-x}$ (x=65) memory device according to an embodiment of the present invention. The reduction of the current results from the fact that the $Sb_xSe_{100-x}$ (x=65) memory device according to an embodiment of the present invention has a lower melting point than the conventional GST memory device.

If the melting point of the material is reduced, its crystallization temperature is also reduced, and the programming current required for the SET operation is reduced. The effect of reducing the programming current by lowering the melting point of the phase-change material is more significant in the RESET operation than in the SET operation. After the phase-change material is melted, it must be quenched to change it from a low resistance crystallization structure to a high resistance amorphous structure.

Figure 6A:
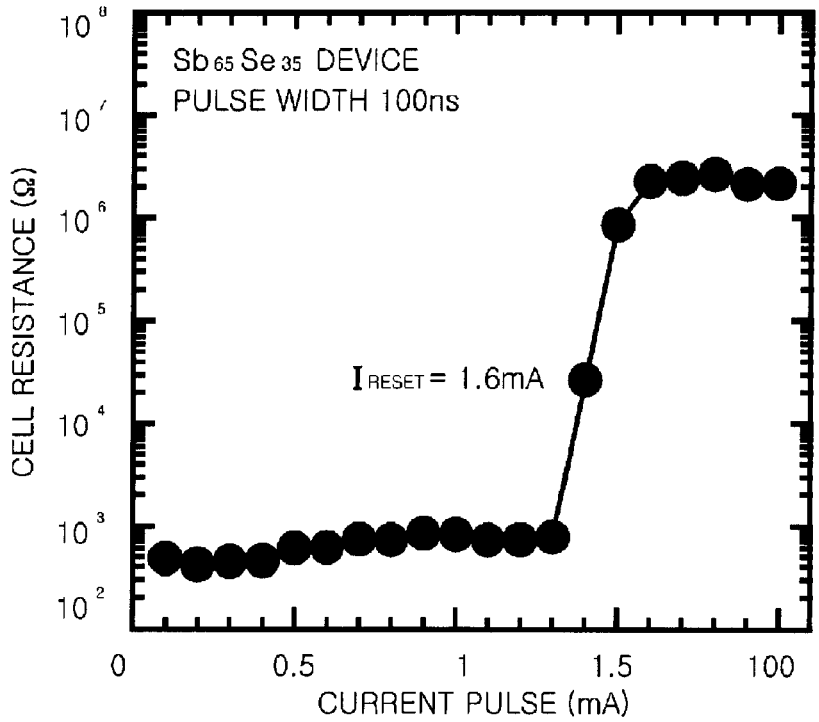
FIG. 6A is a graph of RESET programming operation characteristics when a current is applied to a $Sb_xSe_{100-x}$ (x=65) memory device according to an embodiment of the present invention.
Figure 6B:
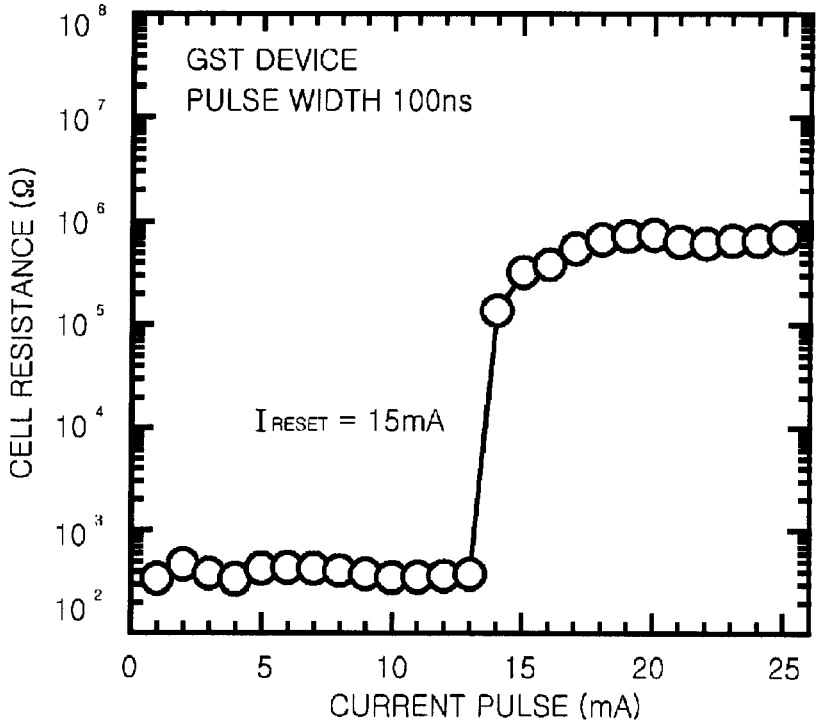
FIG. 6B is a graph of RESET programming operation characteristics when a current is applied to a GST memory device fabricated for comparison with the memory device according to the present invention.

FIG. 6A is a graph of RESET programming operation characteristics when a current is applied to a $Sb_xSe_{100-x}$ (x=65) memory device according to an embodiment of the present invention. FIG. 6B is a graph of RESET programming operation characteristics when a current is applied to a GST memory device fabricated for comparison according to an embodiment of the present invention. The operation characteristics were checked by measuring the resistance of each material while changing the current applied to record data. The pulse width of the applied current was 100 ns.

Referring to FIGS. 6A and 6B, the current required for the RESET operation in the conventional GST memory device was about 15 mA, and the current required for the RESET operation in the $Sb_xSe_{100-x}$ (x=65) memory device according to an embodiment of the present invention was about 1.6 mA. The programming current required for the RESET operation is reduced to about 1/10 by employing the $Sb_xSe_{100-x}$ (x=65) memory device according to an embodiment of the present invention. The reduction of the recording current results from the fact that the $Sb_xSe_{100-x}$ (x=65) according to an embodiment of the present invention has a lower melting point than the conventional GST material. The power consumption of the phase-change memory device depends entirely on the current for the RESET operation to change from a low resistance crystal structure to a high resistance amorphous structure by melting and quenching the material. Therefore, the programming current of the RESET operation must be reduced to achieve a low power consumption phase-change memory device. Obviously, it is preferable to use a phase-change material having a low melting point.

According to the structure of the $Sb_xSe_{100-x}$ memory device of the present invention and the method of fabricating the same as described above, a high speed and low power consumption memory device can be fabricated by employing a $Sb_xSe_{100-x}$ phase-change material layer instead of the conventional GST memory device.

The speed and power consumption can be improved by controlling the content 'x' of antimony in the $Sb_xSe_{100-x}$, to provide a high crystallization speed and a low melting point.

The $Sb_xSe_{100-x}$ (x=65) memory device according to the present invention has a lower power consumption than the conventional GST memory device. Further, by changing the phase-change material while keeping the same device structure and fabrication method as those of the present invention, the programming current required for the RESET operation can be reduced to 1/10 its original value.

While the present invention has been particularly shown and described with reference to exemplary embodiments thereof, it will be understood by those of ordinary skill in the art that various changes in form and detail may be made therein without departing from the spirit and scope of the present invention as defined by the following claims.

What is claimed is:

1. A phase-change memory device comprising:

a heat-generating electrode layer; *and*

[a first insulating layer partially covering the heat-generating electrode layer, exposing a portion of the heat-generating electrode layer, and having a pore therein; and]

an antimony (Sb)-selenium (Se) chalcogenide $Sb_xSe_{100-x}$ phase-change material layer contacting [the portion of] the heat-generating electrode layer [exposed through the pore, and filling the pore], *wherein the content (x) of antimony (Sb) in the $Sb_xSe_{100-x}$ phase-change material layer is in the range of 40 to 59.*

2. The phase-change memory device of claim 1, [wherein the] *further comprising:*

*a first insulating layer partially covering the heat-generating electrode layer, exposing a portion of the heat-generating electrode layer, and having a pore with a* width of [the pore is] less than 500 nm *therein.*

[3. The phase-change memory device of claim 1, wherein the content (x) of antimony (Sb) in the $Sb_xSe_{100-x}$ phase-change material layer is in the range of 40 to 70.]

4. The phase-change memory device of claim 1, wherein the melting point of the $Sb_xSe_{100-x}$ phase-change material layer is in the range of 540 to 570° C.

[5. The phase-change memory device of claim 1, wherein the melting point of the $Sb_xSe_{100-x}$ phase-change material layer is 50 to 80° C. lower than the melting point of a $Ge_2Sb_2Te_5$ phase-change material layer.]

6. The phase-change memory device of claim 1, wherein a time required for crystallization of the $Sb_xSe_{100-x}$ phase-change material layer is decreased as the content (x) of antimony *in the $Sb_xSe_{100-x}$ phase-change material layer* is increased.

7. The phase-change memory device of claim 1, wherein the crystallization temperature of the [$Sb_xSe_{100-x}$] *chalcogenide* phase-change material layer is at least higher than 122° C.

8. A method of fabricating a phase-change memory device, the method comprising:

preparing a substrate;

forming a heat-generating electrode layer on the substrate; *and*

[forming a first insulating layer that partially covers the heat-generating electrode layer, exposes a portion of one side of the heat-generating electrode layer, and has a pore therein; and]

forming an antimony (Sb)-selenium (Se) chalcogenide $Sb_xSe_{100-x}$ phase-change material layer that contacts [the portion of] the [h] *heat-generating* electrode layer [exposed through the pore and fills the pore].

*wherein the content (x) of antimony (Sb) in the $Sb_xSe_{100-x}$ phase-change material layer is in the range of 40 to 59.*

9. The method of claim 8, [wherein the content (x) of antimony (Sb) in the $Sb_xSe_{100-x}$ phase-change material layer is in the range of 40 to 70] *further comprising:*

*forming a first insulating layer that partially covers the heat-generating electrode layer, exposes a portion of one side of the heat-generating electrode layer, and has a pore therein.*

10. The method of claim [8] *9*, wherein the $Sb_xSe_{100-x}$ phase-change material layer is formed by dry etching so as to remain only in a phase-change portion around the pore.

11. [The method of claim 10,] *A method of fabricating a phase-change memory device, the method comprising:*

*preparing a substrate;*

*forming a heat-generating electrode layer on the substrate;*

*forming a first insulating layer that partially covers the heat-generating electrode layer, exposes a portion of one side of the heat-generating electrode layer, and has a pore therein; and*

*forming an antimony (Sb)-selenium (Se) chalcogenide $Sb_xSe_{100-x}$ phase-change material layer that contacts the portion of the heat-generating electrode layer exposed through the pore and fills the pore,*

*wherein the $Sb_xSe_{100-x}$ phase-change material layer is formed by dry etching so as to remain only in a phase-change portion around the pore, and* wherein a pressure of a chamber for etching the $Sb_xSe_{100-x}$ phase-change material layer is in the range of 3 to 5 mTorr.

12. [The method of claim 10,] *A method of fabricating a phase-change memory device, the method comprising:*

*preparing a substrate;*

*forming a heat-generating electrode layer on the substrate;*

*forming a first insulating layer that partially covers the heat-generating electrode layer, exposes a portion of one side of the heat-generating electrode layer, and has a pore therein; and*

*forming an antimony (Sb)-selenium (Se) chalcogenide $Sb_xSe_{100-x}$ phase-change material layer that contacts the portion of the heat-generating electrode layer exposed through the pore and fills the pore,*

*wherein the $Sb_xSe_{100-x}$ phase-change material layer is formed by dry etching so as to remain only in a phase-change portion around the pore, and* wherein an etch gas for etching the $Sb_xSe_{100-x}$ phase-change material layer is a mixture of argon (Ar) and chlorine ($Cl_2$).

13. The method of claim [8] *9*, further comprising forming a second insulating layer covering the phase-change material layer [after forming the $Sb_xSe_{100-x}$ phase-change material layer].

14. The method of claim 13, wherein the second insulating layer is formed using electron cyclotron resonance (ECR) plasma chemical vapor deposition.

15. The method of claim 13, wherein the second insulating layer is formed at room temperature.

*16. A phase-change memory device comprising:*

*a heat-generating electrode layer;*

*a first insulating layer partially covering the heat-generating electrode layer, exposing a portion of the heat-generating electrode layer, and having a pore therein; and*

*an antimony (Sb)-selenium (Se) chalcogenide $Sb_xSe_{100-x}$ phase-change material layer contacting the portion of the heat-generating electrode layer exposed through the pore, and wherein the content (x) of antimony (Sb) in the $Sb_xSe_{100-x}$ phase-change material layer is in the range of 40 to 59.*

* * * * *